(12) United States Patent
Tsvetkov et al.

(10) Patent No.: US 6,656,272 B2
(45) Date of Patent: Dec. 2, 2003

(54) METHOD OF EPITAXIALLY GROWING SUBMICRON GROUP III NITRIDE LAYERS UTILIZING HVPE

(75) Inventors: Denis V. Tsvetkov, Gaithersburg, MD (US); Andrey E. Nikolaev, St. Petersburg (RU); Vladimir A. Dmitriev, Gaithersburg, MD (US)

(73) Assignee: Technologies and Devices International, Inc., Silver Spring, MD (US)

( * ) Notice: Subject to any disclaimer, the term of this patent is extended or adjusted under 35 U.S.C. 154(b) by 50 days.

(21) Appl. No.: 10/112,277

(22) Filed: Mar. 28, 2002

(65) Prior Publication Data

US 2002/0177312 A1 Nov. 28, 2002

Related U.S. Application Data

(60) Provisional application No. 60/283,743, filed on Apr. 13, 2001, and provisional application No. 60/280,604, filed on Mar. 30, 2001.

(51) Int. Cl.[7] .......................... C30B 25/02; C30B 25/04
(52) U.S. Cl. ...................................................... 117/104
(58) Field of Search .......................... 117/84, 94, 99, 117/104

(56) References Cited

U.S. PATENT DOCUMENTS

| | | | | |
|---|---|---|---|---|
| 5,679,965 A | * | 10/1997 | Schetzina | 287/103 |
| 6,110,809 A | | 8/2000 | Sze et al. | 438/503 |
| 6,447,604 B1 | * | 9/2002 | Flynn et al. | 117/89 |
| 6,472,300 B2 | | 10/2002 | Nikolaev et al. | 438/509 |

* cited by examiner

Primary Examiner—Felisa Hiteshew
(74) Attorney, Agent, or Firm—Bingham McCutchen LLP; David G. Beck (57) ABSTRACT

A method and apparatus for fabricating thin Group III nitride layers as well as Group III nitride layers that exhibit sharp layer-to-layer interfaces are provided. According to one aspect, an HVPE reactor includes one or more gas inlet tubes adjacent to the growth zone, thus allowing fine control of the delivery of reactive gases to the substrate surface. According to another aspect, an HVPE reactor includes both a growth zone and a growth interruption zone. According to another aspect, an HVPE reactor includes a slow growth rate gallium source, thus allowing thin layers to be grown. Using the slow growth rate gallium source in conjunction with a conventional gallium source allows a device structure to be fabricated during a single furnace run that includes both thick layers (i.e., utilizing the conventional gallium source) and thin layers (i.e., utilizing the slow growth rate gallium source).

30 Claims, 5 Drawing Sheets

METHOD OF EPITAXIALLY GROWING SUBMICRON GROUP III NITRIDE LAYERS UTILIZING HVPE

CROSS-REFERENCES TO RELATED APPLICATIONS

This application claims priority from U.S. patent application Ser. Nos. 60/280,604 filed Mar. 30, 2001 and 60/283,743, filed Apr. 13, 2001, the disclosures of which are incorporated herein by reference for all purposes.

FIELD OF THE INVENTION

The present invention relates generally to semiconductor devices and, more particularly, to a method and apparatus for fabricating submicron layers of Group III nitride semiconductor materials.

BACKGROUND OF THE INVENTION

III-V compounds such as GaN, AlN, AlGaN, InGaN, InAlGaN, and InGaAlBNPAs have unique physical and electronic properties that make them ideal candidates for a variety of electronic and opto-electronic devices. In particular, these materials exhibit a direct band gap structure, high electric field breakdown, and high thermal conductivity. Additionally, materials such as $In_xAl_{1-x}GaN$ can be used to cover a wide range of band gap energies, i.e., from 1.9 eV (where x equals 1) to 6.2 eV (where x equals 0).

Until recently, the primary method used to grow Group III nitride semiconductors was metal organic chemical vapor deposition (MOCVD) although other techniques such as molecular beam epitaxy (MBE) have also been investigated. In the MOCVD technique, III-V compounds are grown from the vapor phase using metal organic gases as sources of the Group III metals. For example, typically trimethylaluminum (TMA) is used as the aluminum source and trimethylgallium (TMG) is used as the gallium source. Ammonia is usually used as the nitrogen source. In order to control the electrical conductivity of the grown material, electrically active impurities are introduced into the reaction chamber during material growth. Undoped III-V compounds normally exhibit n-type conductivity, the value of the n-type conductivity being controlled by the introduction of a silicon impurity in the form of silane gas into the reaction chamber during growth. In order to obtain p-type material using this technique, a magnesium impurity in the form of biscyclopentadienymagnesium is introduced into the reactor chamber during the growth cycle. As Mg doped material grown by MOCVD is highly resistive, a high temperature post-growth anneal in a nitrogen atmosphere is required in order to activate the p-type conductivity.

Although the MOCVD technique has proven adequate for a variety of commercial devices, the process has a number of limitations that constrain its usefulness. First, due to the complexity of the various sources (e.g., trimethylaluminum, trimethylgallium, and biscyclopentiadienylmagnesium), the process can be very expensive and one which requires relatively complex equipment. Second, the MOCVD technique does not provide for a growth rate of greater than a few microns per hour, thus requiring long growth runs. The slow growth rate is especially problematic for device structures that require thick layers such as high voltage rectifier diodes that often have a base region thickness of approximately 30 microns. Third, n-type AlGaN layers grown by MOCVD are insulating if the concentration of AlN is high (>50 mol. %). Accordingly, the concentration of AlN in the III-V compound layers forming the p-n junction is limited. Fourth, in order to grow a high-quality III-V compound material on a substrate, the MOCVD technique typically requires the growth of a low temperature buffer layer in-between the substrate and III-V compound layer. Fifth, generally in order to obtain p-type III-V material using MOCVD techniques, a post-growth annealing step is required.

Hydride vapor phase epitaxy or HVPE is another technique that has been investigated for use in the fabrication of III-V compound materials. This technique offers advantages in growth rate, simplicity and cost as well as the ability to grow a III-V compound layer directly onto a substrate without the inclusion of a low temperature buffer layer. In this technique III-V compounds are epitaxially grown on heated substrates. The metals comprising the III-V layers are transported as gaseous metal halides to the reaction zone of the HVPE reactor. Accordingly, gallium and aluminum metals are used as source materials. Due to the high growth rates associated with this technique (i.e., up to 100 microns per hour), thick III-V compound layers can be grown.

The HVPE method is convenient for mass production of semiconductor devices due to its low cost, flexibility of growth conditions, and good reproducibility. Recently, significant progress has been achieved in HVPE growth of III-V compound semiconductor materials. AlGaN, GaN and AlN layers have been grown as well as a variety of structures using this technique. Since this technique does not require low temperature buffer layers, a variety of novel device structures have been fabricated, such as diodes with n-GaN/p-SiC heterojunctions. Furthermore, p-type layers have recently been produced using HVPE, thus allowing p-n or p-i-n junction devices to be fabricated.

In order to fully utilize HVPE in the development and fabrication of III-V compound semiconductor devices, thin layers must be produced, on the order of a micron or less. Conventional HVPE techniques have been unable, however, to grow such layers. As a result, the potential of the HVPE technique for fabricating devices based on Group III semiconductors has been limited.

Accordingly, what is needed in the art is a method and apparatus for growing submicron Group III nitride compounds using HVPE techniques. The present invention provides such a method and apparatus.

SUMMARY OF THE INVENTION

The present invention provides a method and apparatus for fabricating thin Group III nitride layers as well as Group III nitride layers that exhibit sharp layer-to-layer interfaces.

According to one aspect of the invention, a method and apparatus for fabricating multi-layer Group III nitride semiconductor devices in a single reactor run utilizing HVPE techniques is provided. Preferably an atmospheric, hot-walled horizontal furnace is used. Sources (Group III metals, Group V materials, acceptor impurities, donor impurities) are located within the multiple source zones of the furnace, the sources used being dependent upon the desired compositions of the individual layers. Preferably HCl is used to form the necessary halide metal compounds and an inert gas such as argon is used to transport the halide metal compounds to the growth zone where they react with ammonia gas. As a result of the reaction, epitaxial growth of the desired composition occurs. By controlling the inclusion of one or more acceptor impurity metals, the conductivity of each layer can be controlled.

In at least one embodiment of the invention, the reactor includes one or more gas inlet tubes adjacent to the growth zone. By directing the flow of gas (e.g., an inert gas) generally in the direction of the substrates, epitaxial growth can be disrupted. The flow of gas can be directed at the substrate or in a direction that simply disrupts the flow of reactive gases such that epitaxial growth is halted.

In at least one embodiment of the invention, the reactor includes both a growth zone and a growth interruption zone. One or more gas inlet tubes direct a flow of gas (e.g., an inert gas) towards the growth interruption zone, thereby substantially preventing any reactive gases from entering into this zone. In use, after the growth of a layer is completed, the substrate is transferred from the growth zone to the growth interruption zone. The temperature of the substrate is maintained during the transfer and while the substrate is within the growth interruption zone, thus preventing thermal shock. While the substrate is within the growth interruption zone, the growth zone is purged and the sources required for the next desired layer are delivered to the growth zone. Once the reaction stabilizes, the substrate is returned to the growth zone. This process continues until all of the required device layers have been grown.

In at least one embodiment of the invention, the reactor uses a slow growth rate gallium source. The slow growth rate gallium source has a reduced gallium surface area. By reducing the surface area, there is less gallium available to react with the halide reactive gas. As a result, less gallium chloride is produced and fine control of the amount of gallium chloride delivered to the growth zone is possible.

In at least one embodiment of the invention, the reactor includes both a conventional gallium source and a slow growth rate gallium source. The slow growth rate gallium source dramatically reduces the surface area of the gallium exposed to the halide reactive gas, resulting in the production of less gallium chloride. Due to the low production levels, finer control of the amount of gallium chloride delivered to the growth zone is possible in contrast to the conventional source. Accordingly, a device can be fabricated during a single furnace run that includes both thick layers (i.e., utilizing the conventional gallium source) and thin layers (i.e., utilizing the slow growth rate gallium source).

In at least one embodiment of the invention, the reactor includes a conventional gallium source, a slow growth rate gallium source, one or more growth zones, and at least one growth disruption zone. The conventional gallium source is used in the fabrication of thick layers; the slow growth rate gallium source is used in the fabrication of thin layers; and the growth disruption zone is used to achieve fine control over layer composition and layer interfaces. The growth interruption zone uses one or more gas inlet tubes to direct a flow of gas towards the growth interruption zone, thereby substantially preventing any reactive gases from entering into the zone.

A further understanding of the nature and advantages of the present invention may be realized by reference to the remaining portions of the specification and the drawings.

DESCRIPTION OF THE SPECIFIC EMBODIMENTS

The present invention provides a method and apparatus for producing submicron layers of III-V compounds utilizing HVPE techniques. As a result of the ability to fabricate such layers, the present invention allows a variety of device structures to be realized as well.

Processes

Figure 1:
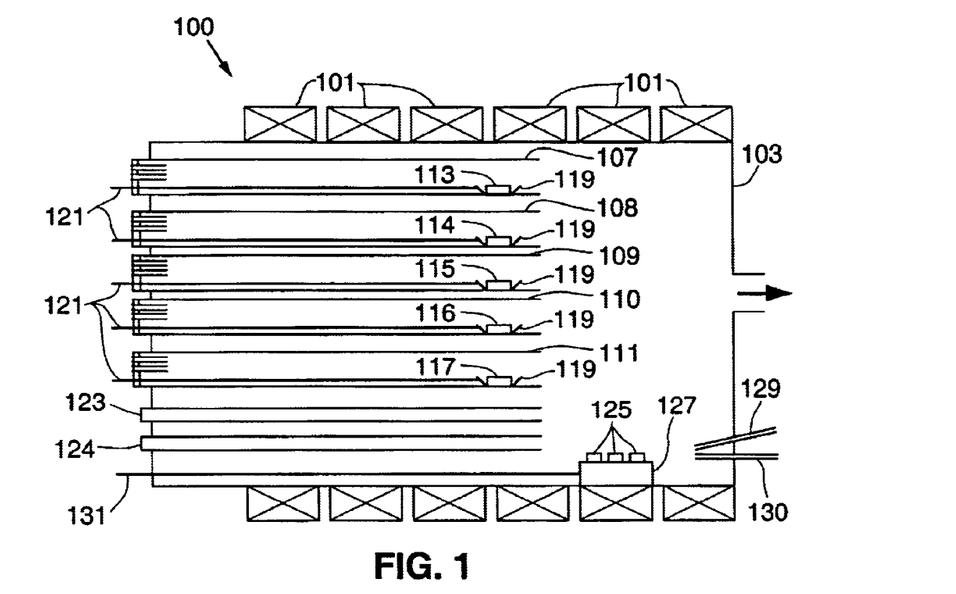
FIG. 1 is a schematic illustration of an atmospheric, hot-walled horizontal furnace as used with a preferred embodiment of the invention.

FIG. 1 is a schematic illustration of an atmospheric, hot-walled horizontal furnace 100 as used with the preferred embodiment of the invention. It should be understood that the invention is not limited to this particular furnace configuration as other furnace configurations (e.g., vertical furnaces) that offer the required control over the temperature, temperature zones, gas flow, source location, substrate location, etc., can also be used. Furnace 100 is comprised of multiple temperature zones, preferably obtained by using multiple resistive heaters 101, each of which at least partially surrounds furnace tube 103. It is understood that although reactor tube 103 preferably has a cylindrical cross-section, other configurations can be used such as a 'tube' with a rectangular cross-section. Within reactor tube 103 are one or more source tubes. As noted with respect to reactor tube 103, although the source tubes preferably have a cylindrical cross-section, the invention is not limited to cylindrical source tubes. Additionally, although source tubes are used in the preferred embodiment of the invention, other means of separating the sources can be used, such as furnace partitions.

In the preferred embodiment shown in FIG. 1, five source tubes 107–111 are used, thus allowing the use of a metallic gallium (Ga) source 113, an aluminum (Al) source 114, an indium (In) source 115, a boron (B) source 116, and a magnesium (Mg) source 117. It is understood that both fewer and greater numbers of source tubes can be used, as well as different sources, depending upon the layers and structures that are to be fabricated.

Preferably within each source tube is a source boat 119. As used herein, the term "boat" simply refers to a means of holding the source material. Therefore boat 119 may simply be a portion of a tube with an outer diameter that is slightly smaller than the inner diameter of the corresponding source tube. Alternately, boat 119 may be comprised of a portion of a tube with a pair of end portions. Alternately, boat 119 may be comprised of a plate of suitable material that fits within the corresponding source tube. Alternately, source material can be held within a source tube without the use of a separate boat. Additionally, alternate boat configurations are known by those of skill in the art and clearly envisioned by the inventors.

Preferably each boat 119 is coupled, either permanently or temporarily, to a corresponding control rod 121. Control rods 121 determine the position of each boat 119 within furnace 103, and thus the temperature of the source in question. Control rods 121 may be manually manipulated, as provided for in the illustrated configuration, or coupled to a robotic positioning system.

In the preferred embodiment of the invention, one or more source tubes 123–124 are used to introduce gases and/or impurities used during the growth process to achieve the desired composition for a specific layer.

One or more substrates 125 are located within the growth zone of reactor 103, the substrates preferably resting on a pedestal 127. Although typically multiple substrates 125 are loaded into the reactor for co-processing, a single substrate can be processed with the invention. Substrates 125 may be comprised of sapphire ($Al_2O_3$), silicon carbide (SiC), silicon (Si), gallium nitride (GaN), or any other suitable single crystal material. Substrates 125 can be produced by any conventional technique. Preferably substrates 125 can be remotely positioned, as well as repositioned during the growth of a structure, thus allowing the growth rate to be varied. Additionally, the temperature of a particular region of the growth zone can be varied by altering the amount of heat applied by heaters 101 that are proximate to the growth zone region in question.

In addition to the previously noted source tubes, including gas source tubes 123–124, in the preferred embodiment of the invention at least one, and preferably more, additional gas inlet tubes 129–130 are located such that the gas flow passing through these tubes can be used to offset the flow of gas passing through source tubes 107–111 and 123–124. As noted in more detail below, gas inlet tubes 129 and 130 are used to direct gas flow either directly onto the growing surface of substrates 125 or otherwise alter the flow of gas from the source tubes onto the growth surface. As a result, it is possible to decrease the growth rate of a specific Group III layer in a controllable manner, even to the extent of completely stopping epitaxial growth.

In a preferred embodiment of the invention, one or more gas inlet tubes (e.g., tube 129) are used to pass an inert gas (e.g., Ar) into the reactor while one or more inlet tubes (e.g., tube 130) are used to pass a halide gas (e.g., HCl) into the reactor. Preferably the reactor includes inlet tubes for both an inert gas and a halide gas, thus providing additional flexibility during the growth process although it is understood that a reactor in accordance with the invention does not require the ability to pass both an inert gas and a halide gas through gas inlet tubes 129–130, either simultaneously or serially, into the reactor in order to control the growth rate.

In addition to controlling the flow of gas into the growth zone, the inventors have found that it is also advantageous to provide a means of moving the substrate within the reactor between various regions of the growth zone or between the growth zone and a region outside of the growth zone (i.e., a growth interruption zone). Preferably substrate holder 127 is coupled to a robotic arm 131, thus allowing remote, rapid, and accurate repositioning of the substrates. Robotic systems are well known and will therefore not be described in further detail herein. In an alternate embodiment of the invention, arm 131 is manually controlled.

Figure 2:
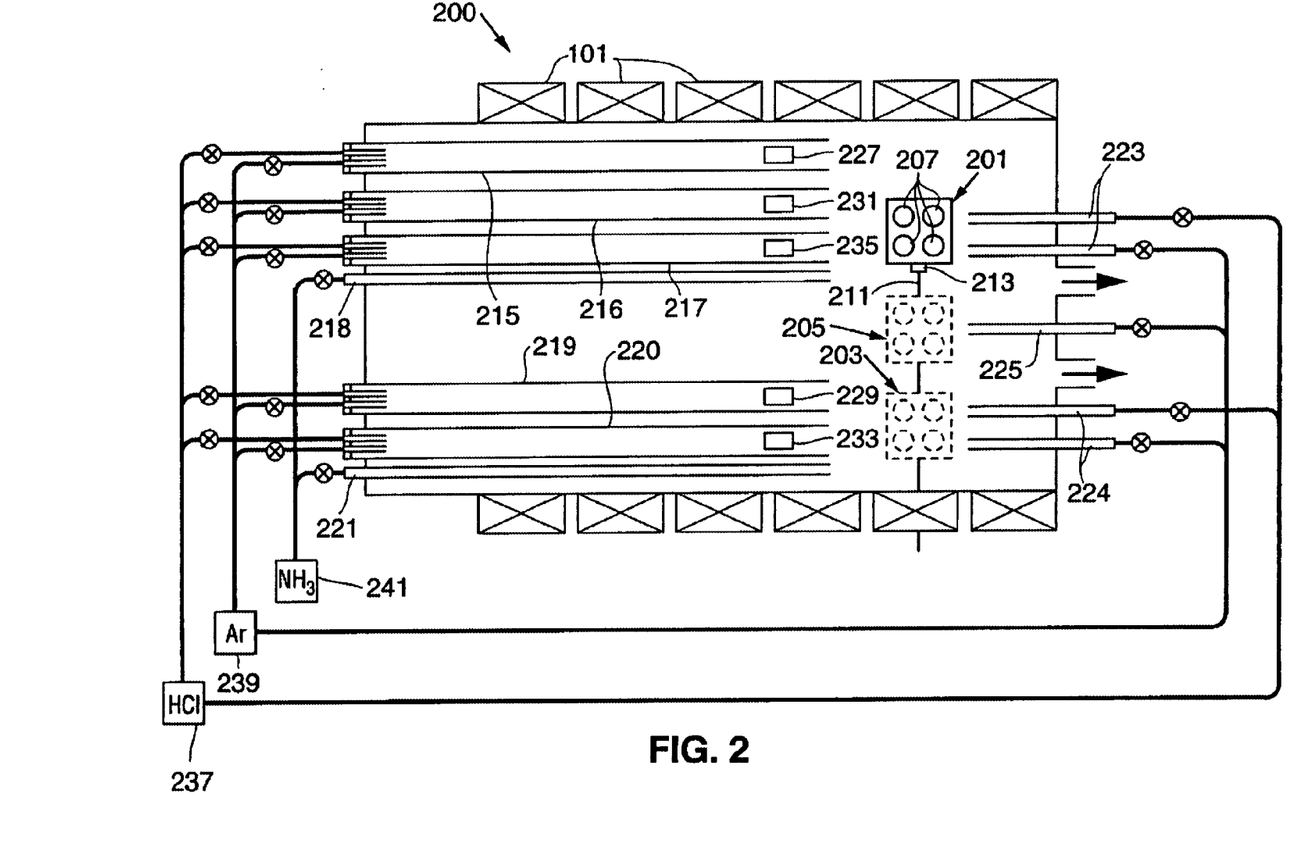
FIG. 2 is a top view of another preferred embodiment of the invention utilizing multiple growth zones as well as a growth interruption zone.

FIG. 2 is a top view of another preferred embodiment of the invention. This embodiment, utilizing both back flow gas sources and substrate movement within the growth zone, allows the achievement of both low growth rates and sharp layer to layer interfaces. As illustrated, reactor 200 includes two distinct growth regions 201 and 203 as well as a growth interruption zone 205 which can be used to further control layer interface sharpness. However, as described further below, the invention does not require multiple growth zones to achieve low growth rates or sharp layer interfaces.

Substrates 207 are positioned on a pedestal 209 coupled to arm 211. Arm 211, preferably coupled to a robotic control system, is used to move the substrates between growth zone regions 201 and 203 (shown in phantom) as well as growth interruption zone 205. In at least one preferred embodiment, means are included to move the substrates along an axis perpendicular to arm 211, thus allowing the growth rate of a particular layer to be further optimized. Preferably pedestal 209 is coupled to arm 211 with an x-y positioner 213, as are known to those of skill in the art.

Adjacent to growth region 201 are source tubes 215–218. Adjacent to growth region 203 are source tubes 219–221. It is anticipated that additional growth zones, and corresponding source tubes, may be desired for certain applications. Additionally, it should be understood that both fewer and greater numbers of source tubes than those illustrated in FIG. 2 may be required, dependent upon the composition of the desired structure layers. The required sources (e.g., Ga, Al, In, etc.) for a specific growth zone depend upon the desired composition to be grown in the zone in question. Due to the need for the same source material in multiple layers (e.g., GaN and AlGaN), it will be appreciated that the same source material (e.g., Ga) may be utilized in more than one source tube, the source tubes located adjacent to different growth zones.

Figure 3:
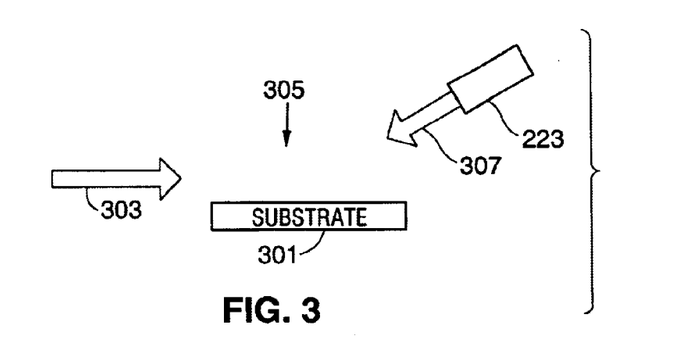
FIG. 3 illustrates one gas inlet configuration used to disrupt the epitaxial growth process.
Figure 4:
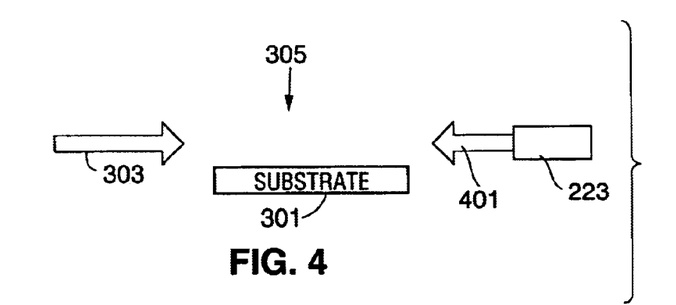
FIG. 4 illustrates an alternate gas inlet configuration used to disrupt the epitaxial growth process.

Adjacent to growth zone 201 are one or more gas inlet tubes 223 and adjacent to growth zone 203 are one or more gas inlet tubes 224. Depending upon the degree or type of desired gas flow disruption, gas inlet tubes are positioned to direct their flow directly at the substrate's surface (e.g., FIG. 3) or simply counter to the gas flow from the source tubes (e.g., FIG. 4). In FIGS. 3 and 4, epitaxial growth on substrate 301 is due to the reaction of halide metal compounds and a reaction gas (e.g., ammonia) flowing in a direction 303. In order to slow the growth rate in growth zone 305 of the epitaxial layer in question, an inert or other gas from a gas inlet tube 223 is either directed at the substrate along a flow direction 307, or in a direction 401 that is counter to the direction of source flow.

In addition to the gas inlet tubes discussed above, one or more gas inlet tubes 225 are preferably positioned adjacent to growth interruption zone 205. When substrates 207 are located in zone 205, inert or other gas from gas inlet tube 225 aids in the immediate cessation of epitaxial growth, thus allowing improved, sharp layer interfaces to be achieved.

It is understood that the HVPE reactor and processing improvements described above can be used during the growth of any HVPE epitaxial layer, thus allowing growth rate control for any layer.

Although the general techniques for HVPE processing are known to those of skill in the art, examples of the HVPE process as well as exemplary structures are provided below. As previously noted, HVPE in general, and the reactor design and process of the current invention in particular, are applicable to many different compositions. Accordingly, it should be understood that the examples provided below are only intended to illustrate HVPE and the disclosed method of obtaining low growth rates, and that different layer compositions and conductivities can be obtained without departing from the invention.

Referring to FIG. 2, boats 227 and 229 contain Ga metal sources, each source providing material for a different growth zone. Similarly, boats 231 and 233 each contain an acceptor impurity metal such as magnesium (Mg) for use in growth zones 201 and 203, respectively. Boat 235 contains an Al source. Source tubes 215, 217 and 219 are each coupled to a supply 237 of a halide reactive gas, preferably HCl. A source of an inert gas such as argon (Ar) 239 is coupled to source tubes 215–217, 219 and 220 while an ammonia gas source 241 is directed at the growth zones via source tubes 218 and 221. One gas inlet tube 223 for growth zone 201, one gas inlet tube 224 for growth zone 203 and gas inlet tube 225 for the growth interruption zone are each coupled to an inert gas, in this example Ar source 239, while the remaining gas inlet tubes 223/224 for growth zones 201/203 are coupled to HCl source 237.

Initially reactor 200 is filled with Ar gas, the flow of Ar gas preferably being in the range of 1 to 25 liters per minute. Substrates 207 are placed in the desired growth zone (e.g., 201) and heated to the preferred growth temperature, preferably in the range of 800° to 1300° C., and more preferably to a temperature of between 1000° and 1300° C., and still more preferably to a temperature of between 1000° and 1100° C. Preferably prior to initiating growth, substrates 207 are etched to remove residual surface contamination, for example using gaseous HCl from supply 237. The Ga source material within boat 227 is heated to a temperature of 650° to 1050° C., and more preferably to a temperature of between 650° and 850° C., after which gaseous HCl from source 237 is introduced into source tube 215. As a result of the reaction between the HCl and the Ga, gallium chloride is formed. The gallium chloride is delivered to growth zone 201 by the flow of Ar gas through source tube 215. Simultaneously, ammonia gas from source 241 is delivered to growth zone 201. The reaction between the gallium chloride and the ammonia causes the epitaxial growth of n-type GaN. The growth rate of the GaN can be controlled by the flow rate of HCl through source tube 215 as well as by the flow rate of HCl and/or Ar through gas inlet tubes 223 coupled to the HCl and Ar sources, allowing growth rates of 10's of microns per minute to less than 0.05 microns per minute. After completion of the desired layer thickness, and assuming no additional layers are required, the flow of HCl through source tube 215 and ammonia gas through source tube 218 is stopped and substrates 207 are cooled in the flowing Ar gas. In order to obtain a sharp layer interface, preferably HCl and/or Ar continue to flow through gas inlet tubes 223. More preferably, substrates 207 are immediately moved to adjacent zone 205 while gas through gas inlet tube 225 continues to cool the substrates.

Although not illustrated, the ratio of donors to acceptors can be further controlled by adding donor impurities to the material as the n-type layer is being grown. Suitable donor materials include, but are not limited to, oxygen (O), silicon (Si), germanium (Ge), and tin (Sn).

In the above example, if a p-type GaN is desired, an appropriate acceptor impurity metal is introduced into growth zone 201 during the epitaxial growth of the desired layer. In the present example, Mg located in boat 231 is used as the acceptor impurity metal, although it is clearly envisioned that other impurity metals can be used (e.g., Mg, Zn, MgZn, etc.).

As shown in FIG. 2, source tube 216 is coupled to Ar gas supply 239. The Mg impurity metal is simultaneously heated with the Ga source to a temperature in the range of 250° to 1050° C. For a Mg impurity metal as shown, preferably the temperature of the source is within the range of 450° to 700° C., more preferably within the range of 550° to 650° C., and still more preferably to a temperature of approximately 615° C. Prior to initiating growth, preferably the acceptor impurity metal is etched, for example using HCl gas, thereby insuring minimal source contamination. During growth, Ar gas is passed through source tube 216 at a relatively high flow rate, preferably between 1000 and 4000 standard cubic centimeters per minute, and more preferably between 2000 and 3500 standard cubic centimeters per minute. Due to the flow of Ar gas, atoms of the acceptor impurity metal are delivered to the growth zone and incorporated into the epitaxially growing GaN material. For p-type GaN material, an annealing step can be used to further improve the properties of this layer, specifically lowering the resistivity of the p-type layer. Preferably the annealing step is performed immediately after the growth of the p-type layer is completed. In the preferred embodiment, the material is annealed for approximately 10 minutes in nitrogen at a temperature within the range of 700° to 800° C. The annealing step helps to drive the hydrogen out of the layer. It is understood that other annealing temperatures and times can used, for example, annealing at a lower temperature for an extended period of time. It is also understood, as previously described, that the annealing step is not required to achieve p-type III-V material according to the invention.

In addition to n-type and p-type III-V compound layers, it is understood that insulating (i-type) III-V layers can also be grown using the present invention. The process is similar to that described above, except that during growth of the III-V material, fewer atoms of the acceptor impurity metal are delivered to the growth zone, thereby leading to a lower doping level. If required, donor impurities can be delivered to the growth zone as well.

As previously noted, although the above example illustrated the HVPE growth process for GaN of various conductivities, other Group III nitride layers can be grown. For example, utilizing the Al source within boat 235, AlGaN layers of the desired conductivity (p-, n-, or i-type) can be grown within growth zone 201. The process used to grow AlGaN layers is quite similar to the GaN process previously described. In this instance, in addition to heating the Ga source, the Al source is heated as well, typically to a temperature within the range of 700° to 850° C. To grow an AlGaN layer, HCl gas 237 is introduced into Ga source tube 215 and Al source tube 217, resulting in the formation of gallium chloride and aluminum trichloride which is delivered to the growth zone by the flow of Ar gas 239. The reaction of ammonia gas 241 introduced into the growth zone simultaneously with the source materials results in the growth of AlGaN. Depending upon the concentration, if any, of acceptor impurities, the AlGaN layer may be n-, i-, or p-type.

It will be understood that the descriptions provided above with respect to the growth of specific composition layers is meant to be illustrative, and not limited, of the invention. For example, other sources can be used such as boron (B), indium (In), arsenic (As) and phosphorous (P). These sources, in combination with the previously noted sources, allow the growth of GaN, AlGaN, AlN, InGaN, InGaAlN, InGaAlBNPAs, etc.

The above examples only utilized growth region 201 of reactor 200. It is understood that the substrates can be moved back and forth between the growth regions of a single reactor (for example, utilizing both growth regions 201 and 203 of reactor 200) and that a reactor can have any number of growth zones ranging from one to two or more. Either disrupting the flow of reactive gases at a growth zone, or moving the substrates to a growth interruption zone can achieve sharp interfaces and fine thickness control. Additionally, as described in further detail below, both conventional and slow growth rate sources can be used, either with a single growth zone or in distinct growth zones.

Figure 5:
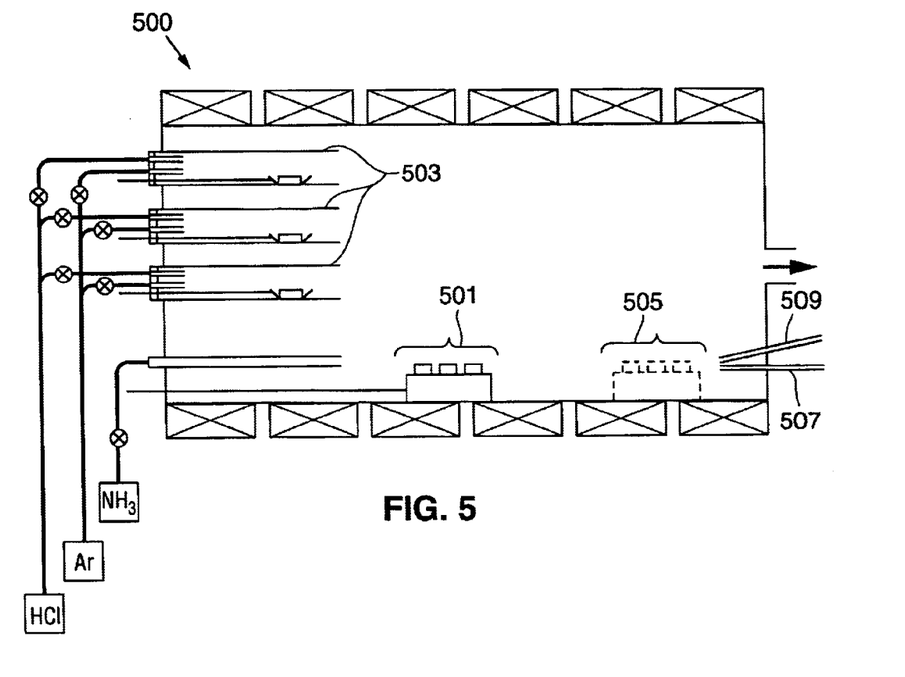
FIG. 5 illustrates another preferred embodiment of the growth disruption zone.

FIG. 5 illustrates another preferred embodiment of the invention. In this embodiment, reactor 500 includes a single growth zone 501, thus minimizing the number of source tubes 503 required. Adjacent to growth zone 501 is a growth interruption zone 505. Zones 501 and 505 can be maintained at the same temperature, thus allowing a substrate to be moved between the zones without inducing thermal shock. The temperature of zones 501 and 505 can also vary slightly as long as the variation is minimal. Preferably the temperatures are within 50° C. of one another, more preferably within 25° C. of one another, still more preferably within 10° C. of one another, still more preferably within 5° C. of one another, and still more preferably within 1° C. of one another.

One or more gas inlet tubes are used to direct gas flow onto a substrate when it is within zone 505, either directing the flow of gas over the substrate (e.g., gas inlet tube 507), or directing the flow of gas directly at the substrate (e.g., gas inlet tube 509). Although the gas directed at or over the substrates can be selected from a variety of gases, preferably the selected gas is an inert gas, and more preferably Ar. As in the prior examples, in order to epitaxially grow a Group III nitride, source tubes 503 are loaded with the appropriate sources (e.g., Ga, Al, Mg) and coupled to appropriate halide (e.g., HCl) and inert (e.g., Ar) delivery gases. Control of the reaction within the growth zone allows the desired material to be grown.

Figure 6:
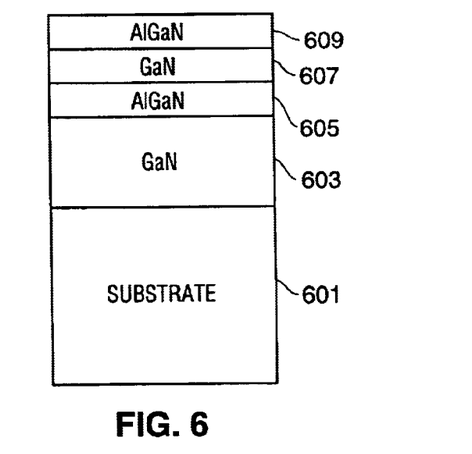
FIG. 6 illustrates an exemplary structure fabricated in accordance with the invention.

Although it will be understood that the embodiment illustrated in FIG. 5 can be used to expitaxially grow any Group III nitride compound of the desired thickness, for purposes of illustration the growth of a GaN/AlGaN/GaN/AlGaN structure as shown in FIG. 6 is described below. This structure illustrates the ability to achieve very low growth rates, and thus thin layers, as well as the ability to achieve very sharp layer to layer interfaces. This process also demonstrates the ability to grow a multi-layer structure without withdrawing the substrates from the reactor or going through a cool-down cycle.

Figure 7:
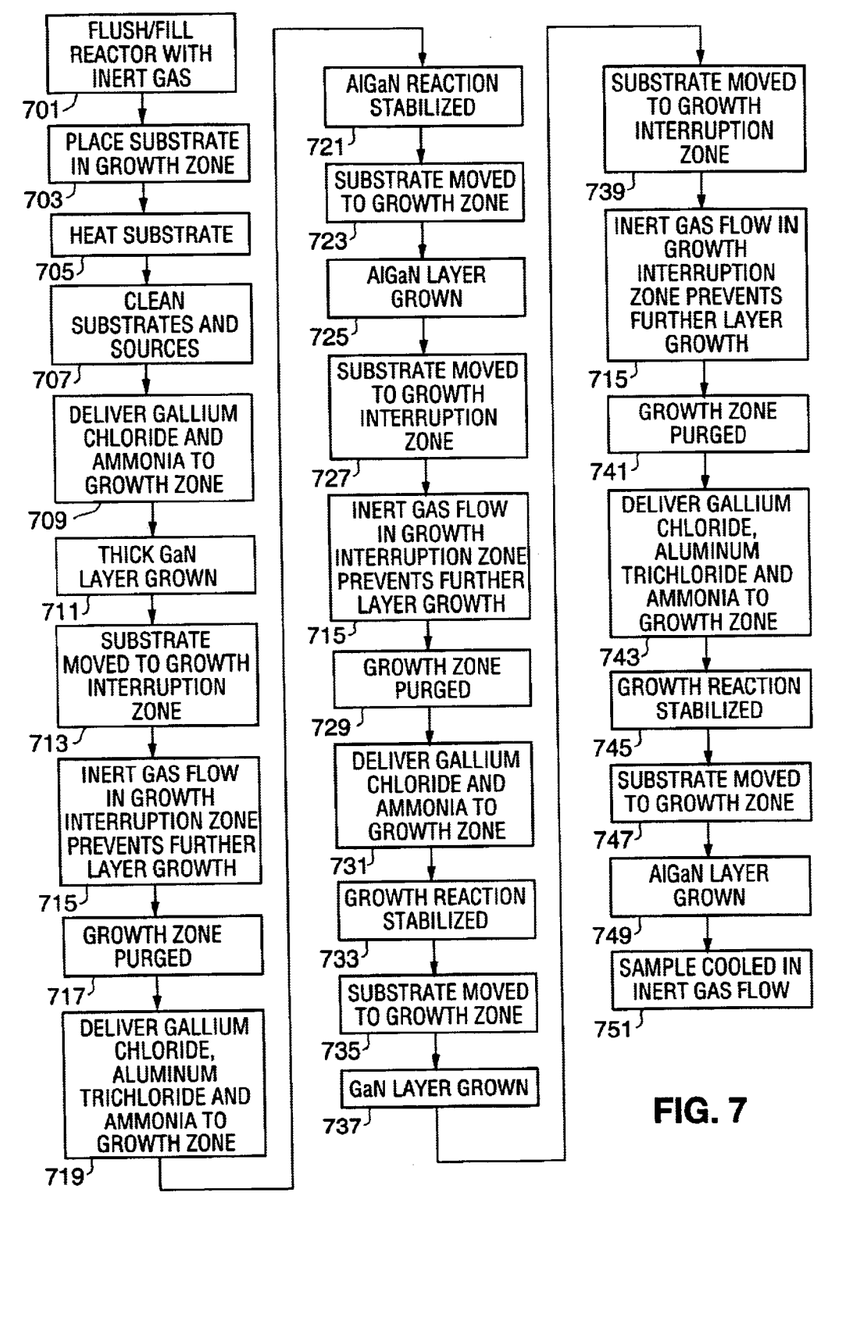
FIG. 7 illustrates an exemplary methodology as used to fabricate the structure shown in FIG. 6.

As in a typical HVPE process, initially reactor 500 is filled with an inert gas (e.g., Ar) (step 701) and the substrate is moved into growth zone 501 (step 703). The substrate can be any of a variety of single crystal materials, including SiC, Si, or GaN, although in this example substrate 601 is comprised of sapphire. The substrate is then heated (step 705) and the substrate and the source surfaces are cleaned, as necessary, typically by an HCl etch (step 707). Gallium chloride and ammonia are delivered to the growth zone (step 709) where they react to form GaN layer 603 (step 711).

In this example after a relatively thick layer of GaN is grown, on the order of 10 microns, the substrate is moved into the growth interruption zone 505 (step 713). Zone 505 is at the same temperature as growth zone 501, thus preventing thermal shock to the structure as the substrate is transferred between zones. Preferably inert gas (e.g., Ar) is directed at the substrate within zone 505, thus insuring that growth of GaN is stopped (step 715). The inert gas can be directed at the substrate, above the substrate, with a flow direction that is opposite the flow of gas from the sources, with a flow direction that is perpendicular to the flow of gas from the sources, or utilizing some other flow direction.

After growth zone 501 has been sufficiently purged with an inert gas (e.g., Ar) (step 717), typically requiring on the order of 5 minutes, gallium chloride, aluminum trichloride and ammonia gas are delivered to the growth zone to achieve the desired layer composition (step 719). Preferably the gas delivery system and the gas reaction is allowed to stabilize (step 721) for a period of time, typically on the order of 3 minutes. The substrate is then moved back into growth zone 501 (step 723) and AlGaN layer 605 is grown (step 725). To achieve a thin AlGaN layer, the substrate is kept in the growth zone for a very short period of time, typically between 1 and 30 seconds. In the present example, to achieve a 0.03 micron thick layer, growth was only allowed for 5 seconds.

After the desired AlGaN layer has been grown, the substrate is again moved into the growth interruption zone 505 (step 727) where inert gas backflow insures the interruption of growth. Zone 501 is purged with Ar gas (step 729) and then gallium chloride and ammonia gas are reintroduced into the growth zone in a manner suitable for low growth (step 731). Once the growth reaction has stabilized (step 733), typically requiring on the order of 5 minutes, the substrate is moved back into growth zone 501 (step 735) and GaN layer 607 is grown (step 737). In the present example, to achieve a 0.005 micron thick layer, growth was only allowed for 10 seconds and the slow growth rate Ga source described in detail below was used. Due to the use of growth interruption zone 505 and the purging/stabilizing process described above, layer 607 does not include any trace of aluminum.

Once layer 607 is complete, the substrate is again moved into the growth interruption zone 505 (step 739) where inert gas backflow insures the interruption of growth. Zone 501 is purged with Ar gas (step 741) and then aluminum trichloride, gallium chloride and ammonia gas are reintroduced into the growth zone in a manner suitable for low growth (step 743). Once the growth reaction has stabilized (step 745), the substrate is moved back into growth zone 501 (step 747) and AlGaN layer 609 is grown (step 749). In the present example, a 0.02 micron thick layer was grown. After completion of the final layer, the substrate is cooled in flowing inert gas (step 751).

In order to achieve the desired sharp layer interfaces, the inventors have found that after removal of the substrate from the growth zone to the growth interruption zone, between 3 and 10 minutes is required for purging the growth zone and achieving a stable reaction for the next layer.

It will be appreciated that the above example, in terms of the number of layers (i.e., device complexity), the composition of the layers, the conductivity of the layers, and the thickness of the layers, is only meant to be illustrative of a preferred embodiment of the present invention.

In some instances extremely thin (e.g., less than 0.05 microns) Group III nitride layers are required. In other instances, maintaining the desired layer thickness is critical. The inventors have found that in these instances a modified Ga source is required.

A conventional HVPE Ga source is typically located in a quartz boat such that there is a relatively large volume of Ga melt and thus a large surface area exposed to the reactive gas (e.g., HCl). Such a Ga melt generally has an exposed surface area of several square centimeters. Controlling the flow of the reactive gas varies the growth rate associated with such a source. However if the gas flow is too low, the growth rate becomes unstable leading to non-reproducible layers (and thus structures). Accordingly, reproducible layers typically require a growth rate of 10 microns per hour or higher.

Figure 8:
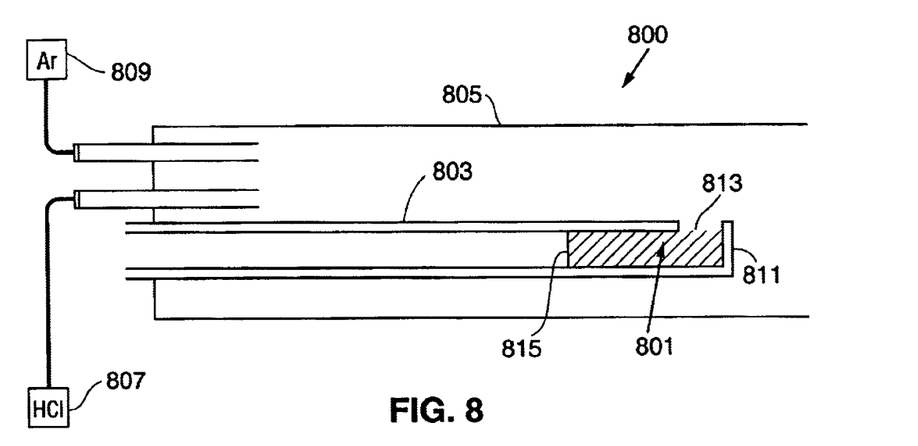
FIG. 8 is an illustration of a low growth rate Ga source.

According to a preferred embodiment of the invention, a slow growth rate Ga source 800 is used in order to controllably grow thin (e.g., less than 0.05 microns) layers of GaN, AlGaN, InGaN, InGaAlN, InGaAlBNPAs, etc. As Ga source 800 is not suitable for growth rates in excess of 0.1 microns per hour, preferably Ga source 800 is used in conjunction with a conventional Ga source within the reactor, thus allowing the growth of structures utilizing both thin and thick layers. Ga source 800 and the conventional Ga source can be used with a single growth zone or in distinct growth zones.

As illustrated in FIG. 8, Ga source 800 is comprised of Ga source material 801 confined within a quartz channel 803. Quartz channel 803 is held within a standard quartz source tube 805. As with a conventional Ga source, source tube 805 is coupled to a reactive halide gas (e.g., HCl gas source 807) and an inert delivery gas (e.g., Ar gas source 809). It is understood that source tube 805 is located within the reactor in a similar manner to a conventional source tube (e.g., Ga source tube 107 in reactor 100, Ga source tubes 215 and 219 in reactor 200, Ga source tube 503 in reactor 500). In the preferred embodiment of source 800, an end portion 811 is turned up such that the open portion of quartz channel 803 is on the top surface. As a result, only a small portion 813 of the Ga source is allowed to react with the halide gas thus achieving a growth rate of less than 1 micron per hour, and preferably less than 0.1 microns per hour. Preferably the exposed portion of the Ga source has an open surface area of less than 4 square millimeters, more preferably less than 2 square millimeters, and still more preferably less than 1 square millimeter. If necessary, Ar gas can be used to apply pressure to the back surface 815 of the Ga source, thus insuring that the Ga continues to fill aperture 813 of channel 803.

Figure 9:
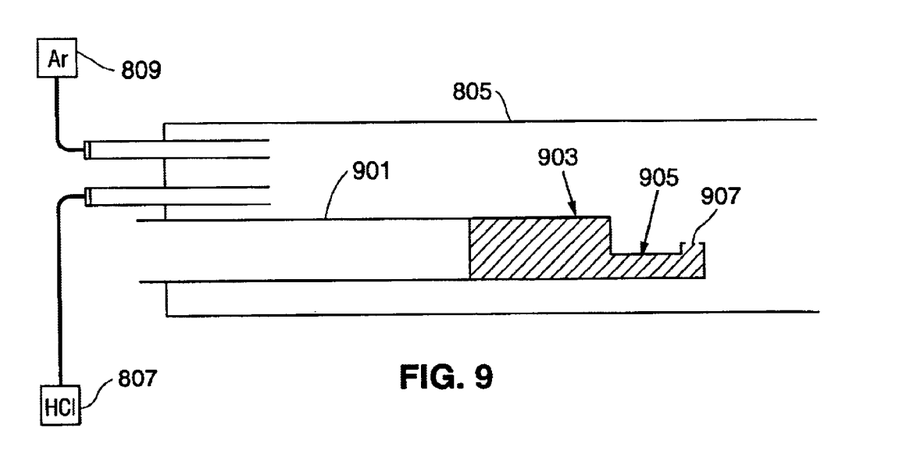
FIG. 9 is an illustration of an alternate low growth rate Ga source.

FIG. 9 illustrates an alternate embodiment of a suitable low growth rate source. As shown, a quartz channel 901 includes a large reservoir region 903, a necked down region 905, and an aperture 907 on the top surface that allows the exposure of only a small portion of the Ga source.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A method of epitaxially growing a thin Group III nitride layer utilizing HVPE techniques, the method comprising the steps of:
   locating a gallium (Ga) source in a quartz channel within a first source zone of an HVPE reactor, said Ga source having a exposed surface area of less than 4 square millimeters;
   locating a substrate within a growth zone of said HVPE reactor, wherein said growth zone is maintained at a first temperature;
   heating said Ga source to a second temperature;
   introducing a halide reaction gas into said first source zone to form a gallium chloride compound;
   transporting said gallium chloride compound to said growth zone;
   transporting a reaction gas to said growth zone, said reaction gas containing nitrogen (N);
   reacting said gallium chloride compound with said reaction gas to achieve an epitaxial growth rate of less than 0.1 microns per hour;
   growing the thin Group III nitride layer to a thickness of less than 0.02 microns;
   transferring said substrate to a growth interruption zone maintained at a third temperature, wherein said third temperature is within 50° C. of said first temperature;
   directing an inert gas in a flow direction that substantially prevents said gallium chloride compound and said reaction gas from entering said growth interruption zone; and
   discontinuing said steps of transporting said gallium chloride compound and said reaction gas to said growth zone.

2. The method of claim 1, further comprising the steps of:
   locating said substrate within said growth interruption zone prior to said steps of transporting said gallium chloride compound and said reaction gas to said growth zone;
   stabilizing the reaction between said reaction gas and said gallium chloride compound; and
   transferring said substrate from said growth interruption zone to said growth zone after completion of said stabilizing step.

3. The method of claim 2, wherein said stabilizing step is performed for at least three minutes.

4. The method of claim 1, further comprising the step of maintaining said third temperature to within 25° C. of said first temperature.

5. The method of claim 1, further comprising the step of maintaining said third temperature to within 10° C. of said first temperature.

6. The method of claim 1, further comprising the step of maintaining said third temperature to within 5° C. of said first temperature.

7. The method of claim 1, further comprising the step of maintaining said third temperature to within 1° C. of said first temperature.

8. The method of claim 1, wherein said flow direction of said inert gas directing step is substantially orthogonal to a source flow direction.

9. The method of claim 1, wherein said flow direction of said inert gas directing step is substantially opposite to a source flow direction.

10. The method of claim 1, wherein said flow direction of said inert gas directing step is angled at a growth surface of said substrate.

11. The method of claim 1, further comprising the steps of:
   locating a second Group III metal in a second source zone of said HVPE reactor;
   heating said second Group III metal to a fourth temperature;
   introducing said halide reaction gas into said second source zone to form a second Group III metal halide compound; and
   transporting said second Group III metal halide compound to said growth zone, wherein said thin Group III nitride layer is comprised of said Ga, said second Group III metal and nitrogen, and wherein said thin Group III nitride layer is formed by said reaction gas reacting with said gallium chloride compound and said second Group III metal halide compound.

12. The method of claim 11, wherein said second Group III metal is selected from the group consisting of gallium (Ga), aluminum (Al), indium (In) and boron (B).

13. The method of claim 11, further comprising the steps of:
   locating a third Group III metal in a third source zone of said HVPE reactor;
   heating said third Group III metal to a fifth temperature;
   introducing said halide reaction gas into said third source zone to form a third Group III metal halide compound; and
   transporting said third Group III metal halide compound to said growth zone, wherein said thin Group III nitride layer is comprised of said Ga, said second Group III metal, said third Group III metal and nitrogen, and wherein said thin Group III nitride layer is formed by said reaction gas reacting with said gallium chloride compound, said second Group III metal halide compound and said third Group III metal halide compound.

14. The method of claim 13, wherein said third Group III metal is selected from the group consisting of gallium (Ga), aluminum (Al), indium (In) and boron (B).

15. The method of claim 13, further comprising the steps of:

locating a fourth Group III metal in a fourth source zone of said HVPE reactor;

heating said fourth Group III metal to a sixth temperature;

introducing said halide reaction gas into said fourth source zone to form a fourth Group III metal halide compound; and transporting said fourth Group III metal halide compound to said growth zone, wherein said thin Group III nitride layer is comprised of said Ga, said second Group III metal, said third Group III metal, said fourth Group III metal and nitrogen, and wherein said thin Group III nitride layer is formed by said reaction gas reacting with said gallium chloride compound, said second Group III metal halide compound, said third Group III metal halide compound and said fourth Group III metal halide compound.

16. The method of claim 15, wherein said fourth Group III metal is selected from the group consisting of gallium (Ga), aluminum (Al), indium (In) and boron (B).

17. The method of claim 1, wherein said discontinuing step is performed prior to said transferring step.

18. The method of claim 1, further comprising the step of transporting at least one acceptor impurity metal to said growth zone, wherein said thin Group III nitride layer contains said at least one acceptor impurity metal.

19. The method of claim 18, wherein said thin Group III nitride layer has a p-type conductivity.

20. The method of claim 18, wherein said at least one acceptor impurity metal is selected from the group consisting of magnesium (Mg), zinc (Zn) and magnesium-zinc (MgZn) alloys.

21. The method of claim 1, further comprising the step of transporting at least one donor impurity to said growth zone, wherein said thin Group III nitride layer contains said at least one donor impurity.

22. The method of claim 21, wherein said at least one donor is selected from the group consisting of oxygen (O), germanium (Ge), silicon (Si) and tin (Sn).

23. The method of claim 1, wherein said thickness in said growing step is less than 0.01 microns.

24. The method of claim 1, wherein said thickness in said growing step is less than 0.005 microns.

25. The method of claim 1, further comprising the steps of:

locating a Group V material in a second source zone of said HVPE reactor;

transporting said Group V material to said growth zone, wherein said thin Group III nitride layer is comprised of said gallium, said Group V material and nitrogen.

26. The method of claim 1, wherein said exposed surface area is less than 2 square millimeters.

27. The method of claim 1, wherein said exposed surface area is less than 1 square millimeter.

28. The method of claim 1, wherein said expitaxial growth rate is less than 0.05 microns per hour.

29. The method of claim 1, wherein said expitaxial growth rate is less than 0.01 microns per hour.

30. The method of claim 1, wherein said expitaxial growth rate is less than 0.005 microns per hour.

* * * * *